(12) United States Patent
Toth et al.

(10) Patent No.: US 6,657,294 B2
(45) Date of Patent: Dec. 2, 2003

(54) DATA CARRIER HAVING AN IC MODULE WITH A PROTECTION MECHANISM FOR PROTECTING THE PARTS OF THE IC MODULE FROM MECHANICAL STRESS

(75) Inventors: Marcus Toth, Gratkorn (AU); Joachim Heinz Schober, Graz (AU); Peter Schmallegger, Graz (AU); Veronika Sauer, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/863,565

(22) Filed: May 23, 2001

(65) Prior Publication Data

US 2002/0020900 A1 Feb. 21, 2002

(30) Foreign Application Priority Data

May 23, 2000 (EP) .............................. 00890164

(51) Int. Cl.[7] ............................................. H01L 23/04
(52) U.S. Cl. ...................... 257/698; 257/707; 257/732; 257/783
(58) Field of Search ................................ 257/698, 707, 257/732, 782, 783, 700, 704, 706; 438/121, 123, 156

(56) References Cited

U.S. PATENT DOCUMENTS

| | | | | |
|---|---|---|---|---|
| 4,746,392 A | | 5/1988 | Hoppe | .................... 156/244 |
| 5,436,203 A | * | 7/1995 | Lin | .............................. 29/841 |
| 5,739,588 A | * | 4/1998 | Ishida et al. | ................. 257/782 |
| 5,977,626 A | * | 11/1999 | Wang et al. | ................. 257/707 |
| 6,075,289 A | * | 6/2000 | Distefano | .................... 257/732 |
| 6,157,085 A | * | 12/2000 | Terashima | ................... 257/783 |
| 6,329,228 B1 | * | 12/2001 | Terashima | ................... 438/156 |

FOREIGN PATENT DOCUMENTS

| | | |
|---|---|---|
| EP | 0211360 B1 | 2/1987 |
| EP | 0766197 A1 | 4/1997 |

* cited by examiner

Primary Examiner—David Nelms
Assistant Examiner—Dao H. Nguyen
(74) Attorney, Agent, or Firm—Steven R. Biren

(57) ABSTRACT

A data carrier (1) includes an IC module (3), having a substrate (4), and a conductor configuration (5) connected to the substrate (4), and an IC (2) connected to the substrate (4), and connecting leads (10, 11) between the conductor configuration (5) and the IC (2), and a cover (12) of an electrically insulating material, which cover (12) shrouds the IC (2) and the connecting leads (10, 11) and the portions (13, 14, 15) of the conductor configuration (5) The data carrier (1) is equipped with a protection mechanism (20) that provides protection against damage to at least a part of the IC module (3) when the IC module (3) is bent or twisted, which protection mechanism (20) forms a part of the IC module (3), consists of a ductile material, and is formed by a layer-shaped, preferably net-like, cap which is encased in the cover (12) up to the substrate means (4).

6 Claims, 1 Drawing Sheet

DATA CARRIER HAVING AN IC MODULE WITH A PROTECTION MECHANISM FOR PROTECTING THE PARTS OF THE IC MODULE FROM MECHANICAL STRESS

BACKGROUND OF THE INVENTION

The invention relates to a data carrier having an IC module, which IC module comprises the parts specified hereinafter, i.e. a substrate means, and a conductor configuration connected to the substrate means, and an IC connected to the substrate means, and connecting leads between the conductor configuration and the IC, and a cover of an electrically insulating material, which cover shrouds the IC and the connecting leads and the portions of the conductor configuration which are electrically connected to the connecting leads, and which data carrier is equipped with a protection means that provides protection against damage to at least a part of the IC module when the IC module is bent or twisted.

Such a data carrier of the type defined in the opening paragraph and such an IC module of the type defined in the second paragraph are known, for example from the patent document EP 0 211 360 B1. In accordance with these known solutions the data carrier has a protection means which is separate from the IC module of the data carrier, which protection means is a reinforcement means, which may consist of a variety of materials and which in view of its reinforcement function has an increased resistance to excessive deformations of the data carrier and thus fulfils its protective function for the data carrier and the IC module included in the data carrier. According to the known solution the protective function of the protection means is obtained only once the IC module has been incorporated in the data carrier while with the IC module not yet incorporated in the data carrier no protective function for the IC module and the parts of the IC module is guaranteed.

SUMMARY OF THE INVENTION

It is an object of the invention to solve the aforementioned problems and to provide an improved data carrier and an improved IC module.

According to the invention, in order to achieve the object described above, a data carrier of the type defined in the opening paragraph is characterized in that the protection means forms a part of the IC module, and the protection means consists of a ductile material.

Moreover, according to the invention, in order to achieve the aforementioned object, an IC module of the type defined in the second paragraph is characterized in that the IC module is equipped with a protection means that provides protection against damage to at least a part of the IC module when the IC module is bent or twisted, and the protection means consists of a ductile material, and the protection means is formed by a layer-shaped cap which is encased in the cover up to the substrate means.

With the aid of the solutions in accordance with the invention it is achieved that by the use of simple means which can be realized simply an IC module of a data carrier and the parts of this IC module are protected very effectively against bending or twisting already before such an IC module is incorporated in a data carrier, which is very advantageous because this already provides a protective function before incorporation of such an IC module in a data carrier, so that even a non-incorporated IC module is protected against undesirable negative influences.

In the construction in accordance with the invention the cap provided as a protective means envelops the cover up to the substrate means. In this respect it is emphasized that the cap may be constructed in such a manner that it can shroud not only the cover but also a portion of the substrate means adjacent the cover. Furthermore, the construction can be such that the cap provided as a protection means does not extend completely up to the substrate means but that a narrow portion of the cover adjacent the substrate means is not covered by the cap.

It has proved to be very advantageous when a data carrier in accordance with the invention and an IC module in accordance with the invention in addition have the characteristic features as defined in claim 2 and in claim 4, respectively. Such a construction has the advantage that it saves material and, moreover, such a construction ensures that deformation stresses acting in different directions are absorbed very effectively.

The aforementioned as well as further aspects of the invention will become apparent from the embodiment described hereinafter by way of example and will be elucidated with reference to this example.

BRIEF DESCRIPTION OF THE DRAWING

The invention will now be described in more detail with reference to the drawing, which shows an embodiment given by way of example but to which the invention is not limited.

The invention will now be described in more detail with reference to the drawing, which shows an embodiment given by way of example but to which the invention is not limited.

DESCRIPTION OF THE PREFERRED EMBODIMENTS

Figure 1:
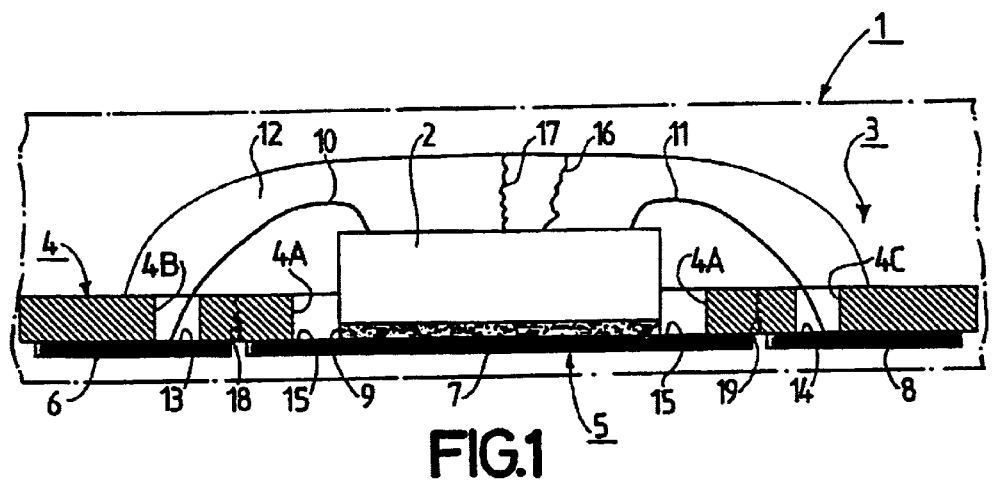
FIG. 1 diagrammatically shows a part of a prior-art data carrier including a prior-art IC module, said part being shown to an exaggerate scale in the thickness direction.

FIG. 1 shows a part of a data carrier, which part is relevant in the present context and is marked off in dash-dot lines. The data carrier 1 is adapted to provide contactless communication with a write/read station. For this purpose, the data carrier 1 includes a transmission coil, which is not shown in FIG. 1 and which is connected to an integrated circuit (IC) 2 in an electrically conductive manner, which IC 2 takes the form of a transponder IC and forms part of an IC module 3, which is shown in solid lines in FIG. 1.

The IC module 3 has the following parts, i.e. a substrate means 4 formed by a ribbon substrate made of glass-fiber reinforced epoxy resin, and a conductor configuration 5 consisting of copper and connected to the substrate means 4, of which configuration three conductor portions 6, 7 and 8 are visible in FIG. 1, and the IC2, which is situated in a first recess 4A in the substrate means 4 and which is mechanically connected to the conductor portion 7 of the conductor configuration 5 with the aid of an adhesive layer 9 and which is connected to the substrate means 4 via the conductor configuration 5, and two connecting leads 10 and 11 arranged between the conductor configuration 5, i.e. the two conductor portions 6 and 8 of the conductor configuration 5, and the IC2, which connecting leads are each passed through a respective further recess 4B and 4C in the substrate means 4, and a cover 12 of an electrically insulating material, which covers the IC2 and the two connecting leads 10 and 11 and the two portions 13 and 14 of the conductor configuration 5, which are electrically connected to the connecting leads 10 and 11 and which close the recesses 4B and 4C, as well as a further portion 15 of the conductor configuration 5, which further portion closes the recess 4A.

The known data carrier 1 and the known IC module 3 have the problem that in the case of bending or twisting of IC module 3, either when not yet incorporated in the data carrier 1 or when already incorporated in the data carrier 1, it is quite likely that fracture zones are formed in the area of the comparatively vulnerable parts of the IC module, i.e. for example in the area of the cover 12 and in the area of the substrate means 4. FIG. 1 diagrammatically shows such fracture zones 16, 17, 18 and 19. The presence of such fracture zones endanger the correct operation of the IC module 3 and, consequently, of the data carrier 1, which is obviously disadvantageous and undesirable.

Figure 2:
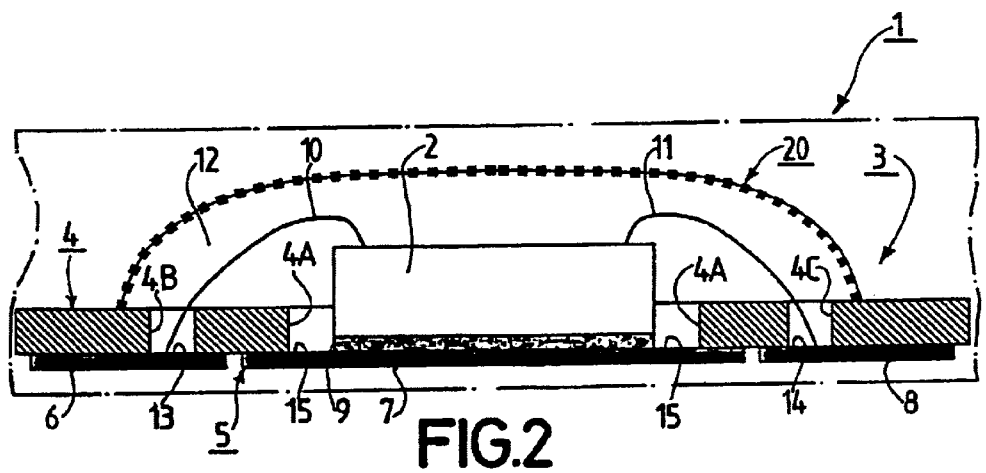
FIG. 2 shows, in a manner similar to FIG. 1, a part of a data carrier in accordance with an embodiment of the invention, including an IC module in accordance with an embodiment of the invention.

FIG. 2 shows a data carrier 1 in accordance with the invention having an IC module 3 in accordance with the invention. The data carrier 1 shown in FIG. 2 and its IC module 3 are largely of the same design as used in the data carrier 1 shown in FIG. 1.

An essential difference between the data carrier 1 shown in FIG. 2 and the data carrier shown in FIG. 1 is that the data carrier 1 shown in FIG. 2 has a protection means 20 which protects at least one part of the IC module 3 in the case of bending or twisting of the IC module 3. The protection 20 advantageously forms a part of the IC module 3, as a result of which the protection means also fulfils its protective function for the IC module 3 when the IC module 3 has not yet been incorporated in the data carrier 1. The protection means 20 consists of a ductile material, i.e. of copper in the present case. The protection means 20 is formed by a layer-shaped cap encased in the cover 12 up to the substrate means 4. In a particularly advantageous manner the protection means 20 is formed by a cap having a net-like shape. The net-like shape may be a net shape having square meshes but it may also be of the honeycomb type. However, the protection means 20 may alternatively consist of an imperforate layer of a ductile material, for example of silver or gold or aluminum.

As a result of the ductility of the cap provided as the protection means it is achieved that when the data carrier 1 and the IC module 3 is bent or twisted the formation of fracture zones in the vulnerable parts of the IC module 3 is precluded. Of course, this is only within certain limits of the degree to which the IC module is bent or twisted, because excessive bending loads or twisting loads will obviously result in breakage of the vulnerable parts of the IC module 3. However, owing to the provision of the ductile cap the limits at which such breakage occurs is shifted towards distinctly higher values than in the case of the known data carrier and the known IC module.

What is claimed is:

1. A data carrier (1) having an IC module (3), which IC module (3) comprises a substrate means (4), and a conductor configuration (5) connected to the substrate means (4), and an IC (2) connected to the substrate means (4), and connecting leads (10, 11) between the conductor configuration (5) and the IC (2), and a cover (12) of an electrically insulating material, which cover (12) shrouds the IC (2) and the connecting leads (10,11) and the portions (13, 14) of the conductor configuration (5) which are electrically connected to the connecting leads (10, 11), and which data carrier (1) is equipped with a protection means (20) that provides protection against damage to at least a part of the IC module (3) when the IC module (3) is bent or twisted, characterized in that the protection means (20) forms a part of the IC module (3), and the protection means (20) consists of a metallic ductile material, and the protection means (20) is formed by a layer-shaped cap which is encased within the cover (12).

2. A data carrier (1) as claimed in claim 1, characterized in that the protection means (20) is formed by a cap having net-like structure.

3. A data carrier (1) as claimed in claim 1, characterized in that the cap extends into contact with the substrate means (4).

4. An IC module (3) for data career, which IC module (3) comprises a substrate means (4), and a conductor configuration (5) connected to the substrate means (4), and an IC (2) connected to the substrate means (4), and connecting leads (10, 11) between the conductor configuration (5) and the IC (2), and a cover (12) of an electrically insulating material, which cover (12) shrouds the IC (2) and the connecting leads (10, 11) and the portions (13, 14) of the conductor configuration (5) which are electrically connected to the connecting leads (10, 11), characterized in that the IC module (3)is equipped with a protection means (20) that provides protection against damage to at least a part of the IC module (3) when the IC module (3) is bent or twisted, and the protection means (20) consists of a metallic ductile material, and the protection means (20) is formed by a layer-shaped cap which is encased within the cover (12) such that protection means (20) is formed to arch over IC module (3).

5. An IC module (3) as claimed in claim 4, characterized in that the protection means (20) is formed by a cap having net-like structure.

6. An IC module (3) as claimed in claim 4, characterized in that the cap extends into contact with the substrate means (4).

* * * * *